(12) United States Patent
Son et al.

(10) Patent No.: US 7,141,116 B2
(45) Date of Patent: Nov. 28, 2006

(54) METHOD FOR MANUFACTURING A SILICON STRUCTURE

(75) Inventors: Yong Hoon Son, Yongin (KR); Jae Young Park, Yongin (KR); Cha Dong Yeo, Suwon (KR); Jong Wook Lee, Yongin (KR); Yu Gyun Shin, Seongnam (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/095,496

(22) Filed: Apr. 1, 2005

(65) Prior Publication Data

US 2006/0048702 A1    Mar. 9, 2006

(30) Foreign Application Priority Data

Sep. 8, 2004   (KR) ............... 10-2004-0071611
Oct. 7, 2004   (KR) ............... 10-2004-0079971

(51) Int. Cl.
*C30B 25/12*   (2006.01)
(52) U.S. Cl. ..................... 117/94; 117/84; 117/89; 117/92
(58) Field of Classification Search .............. 117/84, 117/89, 92, 94
See application file for complete search history.

(56) References Cited

U.S. PATENT DOCUMENTS 5,495,823 A   3/1996   Kobayashi

FOREIGN PATENT DOCUMENTS

| KR | 1999-38114 | 6/1999 |
|---|---|---|
| KR | 10-2001-0037531 A | 5/2001 |

*Primary Examiner*—Felisa Hiteshew
(74) *Attorney, Agent, or Firm*—Harness, Dickey & Pierce

(57) ABSTRACT

Provided are improved methods for forming silicon films, particularly single-crystal silicon films from amorphous silicon films in which a single-crystal silicon substrate is prepared by removing any native oxide, typically using an aqueous HF solution, and placed in a reaction chamber. The substrate is then heated from about 350° C. to a first deposition temperature under a first ambient to induce single-crystal epitaxial silicon deposition primarily on exposed silicon surfaces. The substrate is then heated to a second deposition temperature under a second ambient that will maintain the single-crystal epitaxial silicon deposition on exposed single-crystal silicon while inducing amorphous epitaxial silicon deposition on insulating surfaces. The amorphous epitaxial silicon can then be converted to single-crystal silicon using a solid phase epitaxy process to form a thin, high quality silicon layer. The first and second ambients include at least one silicon source gas and may include a non-oxidizing carrier gas.

21 Claims, 13 Drawing Sheets

METHOD FOR MANUFACTURING A SILICON STRUCTURE

PRIORITY STATEMENT

This application claims priority under 35 U.S.C. § 119 to Korean Patent Applications P2004-71611 and P2004-79971, which were filed on Sep. 8, 2004 and filed on Oct. 7, 2004, the contents of which are incorporated herein, in its entirety and for all purposes, by reference.

BACKGROUND OF THE INVENTION

The present disclosure relates generally to processes and equipment useful for fabricating semiconductor devices, particularly with regard to forming single crystal regions on a substrate and structures that incorporate single crystal regions.

Certain semiconductor fabrication processes and associated process equipment are known for growing thin epitaxial films on the surface of a semiconductor substrate. Such processes may be utilized, for example, in the preparation of silicon-on-insulator (SOI) substrates or for providing improved control of the doping profiles in adjacent semiconductor regions. One such method, as illustrated in FIGS. 1A and 1B, utilizes a solid phase epitaxy (SPE) process to produce single crystal silicon from an amorphous silicon layer or pattern that is in contact with a single crystal seed region. Such processes may be used to form, for example, channel regions in complex three dimensional stacked devices such as SRAMs and thereby obtain device structures that have improved performance.

As illustrated in FIG. 1A, during a conventional SPE process, a single-crystal substrate 201 may have an insulating layer 202 deposited, patterned and etched to form openings 203 that expose a portion of the substrate surface. A selective epitaxial growth process may be used to fill the opening with a single-crystal silicon plug 206 with a top surface that can act as a seed region 204 over which an amorphous silicon layer or pattern 205 can be formed. As illustrated in FIG. 1B, during the subsequent SPE process the amorphous silicon layer 205 will be heated to a temperature sufficient to allow the disordered atoms of the amorphous silicon adjacent the seed region 204 to be reordered into single crystal silicon 206a. The transition between the amorphous and single-crystal configurations of the silicon atoms defines an interface 207a that appears to propagate through the amorphous layer to positions 207b more removed from the seed region 204 as the SPE process continues and more of the amorphous silicon 205 is converted to single-crystal silicon. Depending on the spacing of the original single crystal silicon regions and the duration of the SPE process, some or substantially all of the amorphous silicon can be converted to a single crystal orientation.

A conventional SPE process is illustrated in FIG. 2. As illustrated in FIG. 2, a single crystal silicon substrate 101 is typically held at room temperature (typically about 20 to 25° C.) for some period of time before being introduced into the reaction chamber for epitaxial processing, a native silicon dioxide layer 104 will typically be present on the surface of the silicon substrate. This silicon dioxide layer 104, will typically be removed using a wet etch process incorporating a solution of hydrofluoric acid, HF, to prepare the substrate for additional processing.

As illustrated in FIG. 2, after the single crystal silicon substrate 101 is placed in the reactor, it may initially be exposed to a potentially oxidizing ambient, e.g., air, but as the substrate temperature is increased, the ambient within the reactor will typically be modified to suppress oxidation. These modifications may include reducing the pressure within the reactor chamber and/or introducing a non-oxidizing ambient, such as nitrogen ($N_2$) or argon (Ar) to suppress the growth of oxide on the exposed silicon surface region(s) of the substrate. This shift to a non-oxidizing ambient will typically be initiated at a temperature below about 350° C.

However, despite the shift to a non-oxidizing ambient as the substrate temperature is ramping up into the process temperature range, residual oxygen and/or water within the reactor chamber and/or absorbed on the substrate may result in the formation of a silicon oxide layer ($SiO_x$) 102 on the order of 10 to 15 Å on the surface of the substrate, particularly as the temperature is ramped above 350° C. In a conventional SPE process, the temperature of the substrate and the adjacent reactor chamber components will generally be ramped to and then stabilized or maintained for some period at or near a target deposition temperature, typically about 620° C.

Once the reaction chamber and single crystal silicon substrate 101 have been stabilized at the target deposition temperature, a silicon-containing gas such as silane ($SiH_4$) may be introduced into the reaction chamber with nitrogen ($N_2$) to deposit a silicon thin film 103 on the substrate. However, the presence of the silicon oxide film 102 on the silicon substrate will tend to interfere with the orderly epitaxial formation of a single-crystal silicon film which results in the formation of a substantially polycrystalline silicon thin film 103. Further, with the silicon oxide film 102 interposed between the silicon substrate 101 and the silicon thin film 103, the contact resistance between the two silicon regions will tend to be increased.

BRIEF SUMMARY OF THE INVENTION

An exemplary embodiment of the invention provides a method for forming a single crystal silicon structure including the steps of preparing a single crystal silicon surface that is substantially free of silicon oxide; heating the silicon surface to a first temperature of about 350° C. under a first ambient; further heating the silicon surface to a first silicon deposition temperature between about 350° C. and about 530° C. under a second ambient, the second ambient being maintained within a second pressure range and including a silicon source gas and a non-oxidizing carrier gas; and maintaining the silicon surface at the first silicon deposition temperature under the second ambient for a deposition period sufficient to form a first epitaxial single crystal silicon region having a first thickness on the silicon surface.

Variations of this first embodiment include utilizing a silicon source gas that includes at least one compound selected from a group consisting of $SiH_xZ_y$, wherein Z is a halogen, wherein x and y are integers satisfying the expressions $0 \leq x \leq 4$, $0 \leq y \leq 4$ and $x+y=4$; $Si_2H_{x'}Z_{y'}$, wherein x' and y' are integers satisfying the expressions $0 \leq x' \leq 6$, $0 \leq y' \leq 6$ and $x'+y'=6$; and $Si_3H_{x''}Z_{y''}$, wherein x'' and y'' are integers satisfying the expressions $0 \leq x'' \leq 8$, $0 \leq y'' \leq 8$ and $x''+y''=8$, with the carrier gas includes at least one gas selected from a group consisting of nitrogen, argon and helium, wherein the volume of the carrier gas(es) does not exceed the volume of the silicon source gas(es). In some exemplary embodiments the volume of the carrier gas(es) can be less than 1% of the volume of the silicon source gas(es). Certain of the silicon source gases that may be utilizing in practicing the disclosed exemplary methods include $SiH_4$, $SiH_3Cl$, $SiH_2Cl_2$, $SiHCl_3$, $SiCl_4$ and $Si_2H_6$.

Another exemplary method according to the invention includes the steps of preparing a single crystal silicon surface that is substantially free of silicon oxide; preparing an insulator surface adjacent the silicon surface; heating the silicon surface and the insulator surface to a first temperature of about 350° C. under a first ambient; further heating the silicon surface to a first silicon deposition temperature between about 350° C. and about 530° C. under a second ambient, the second ambient being maintained within a first pressure range, the second ambient including a silicon source gas and a non-oxidizing carrier gas; and maintaining the silicon surface at the first silicon deposition temperature under the second ambient for a deposition period sufficient to form a first epitaxial single crystal silicon region having a first thickness on the silicon surface; further heating the silicon surface to a second silicon deposition temperature of at least about 530° C. under a third ambient, the third ambient being maintained within a third pressure range, the third ambient including a silicon source gas and a non-oxidizing carrier gas; maintaining the silicon surface and insulator surface at the second silicon deposition temperature under the third ambient for a deposition period sufficient to form, in a substantially simultaneous manner, a second epitaxial single crystal silicon region having a second thickness on the first epitaxial single crystal silicon region and a substantially amorphous silicon layer having a third thickness on the insulator surface; and further heating the amorphous silicon layer to an annealing temperature sufficient to induce solid phase epitaxy and convert substantially the entire amorphous silicon layer to single crystal silicon and thereby form a single crystal silicon layer.

Variations on the exemplary embodiment include forming a single crystal silicon structure in which the single crystal silicon surface and the insulator surface are substantially coplanar, a result that may be achieved by utilizing a chemical mechanical polishing (or planarizing) process (CMP).

Another exemplary embodiment of a method according to the invention includes the steps of preparing a single crystal silicon surface; depositing a layer of an insulating material on the silicon surface; forming an opening through the insulating material to expose a portion of the single crystal silicon surface, the exposed portion being substantially free of silicon oxide; performing a selective epitaxial process to fill the opening with a single crystal silicon plug, the silicon plug having an upper surface generally adjacent a top surface of the insulating material; heating the silicon plug to a first silicon deposition temperature between about 350° C. and about 530° C. under a first ambient, the first ambient being maintained within a first pressure range, the first ambient including a silicon source gas and a non-oxidizing carrier gas; maintaining the silicon plug at the first silicon deposition temperature under the first ambient for a deposition period sufficient to form a first epitaxial single crystal silicon region having a first thickness on the upper surface of the silicon plug; further heating the silicon plug to a second silicon deposition temperature of at least about 530° C. under a second ambient, the second ambient being maintained within a second pressure range, the second ambient including a silicon source gas and a non-oxidizing carrier gas; maintaining the silicon surface and insulator surface at the second silicon deposition temperature under the second ambient for a deposition period sufficient to form, in a substantially simultaneous manner, a second epitaxial single crystal silicon region having a second thickness on the first epitaxial single crystal silicon region and a substantially amorphous silicon layer having a third thickness on the insulator surface; and further heating the amorphous silicon layer to an annealing temperature sufficient to induce solid phase epitaxy and convert substantially the entire amorphous silicon layer to single crystal silicon and form a single crystal silicon layer.

Variations on this exemplary embodiment of a method according to the invention can include forming or processing the substrate so that the upper surface of the silicon plug is substantially coplanar with the top surface of the insulating material. Conversely, the selective epitaxial process may be maintained for a period sufficient to overfill the opening after which the substrate can be planarized, e.g., using a CMP process, to produce a substantially planar surface will silicon plugs substantially filling the previously formed openings in the insulating layer.

Another exemplary embodiment of a method according to the invention includes the steps of preparing a first single crystal silicon surface; depositing a layer of a first insulating material on the first silicon surface; forming a first opening through the first insulating material to expose a portion of the first single crystal silicon surface, the exposed portion being substantially free of silicon oxide; performing a selective epitaxial process to fill the first opening with a first single crystal silicon plug, the first silicon plug having an upper surface generally adjacent a top surface of the first insulating material; heating the first silicon plug to a first silicon deposition temperature between about 350° C. and about 530° C. under a first ambient, the first ambient being maintained within a first pressure range, the first ambient including a silicon source gas and a non-oxidizing carrier gas; and maintaining the first silicon plug at the first silicon deposition temperature under the first ambient for a deposition period sufficient to form a first epitaxial single crystal silicon region having a first thickness on the upper surface of the first silicon plug; further heating the first silicon plug to a second silicon deposition temperature of at least about 530° C. under a second ambient, the second ambient being maintained within a second pressure range, the second ambient including a silicon source gas and a non-oxidizing carrier gas; maintaining the first silicon plug and the first insulator surface at the second silicon deposition temperature under the second ambient for a deposition period sufficient to form, in a substantially simultaneous manner, a second epitaxial single crystal silicon region having a second thickness on the first epitaxial single crystal silicon region and a first substantially amorphous silicon layer having a third thickness on the first insulator surface; further heating the amorphous silicon layer to an annealing temperature sufficient to induce solid phase epitaxy and convert substantially the entire amorphous silicon layer to single crystal silicon and form a first single crystal silicon layer; depositing a layer of a second insulating material on the first single crystal silicon layer; forming a second opening through the second insulating material to expose a portion of the first single crystal silicon layer, the exposed portion being substantially free of silicon oxide; performing a selective epitaxial process to fill the second opening with a second single crystal silicon plug, the second silicon plug having an upper surface generally adjacent a top surface of the second insulating material; heating the second silicon plug to the first silicon deposition temperature under the first ambient, the first ambient being maintained within the first pressure range; maintaining the second silicon plug at the first silicon deposition temperature under the first ambient for a deposition period sufficient to form a third epitaxial single crystal silicon region having a third thickness on the upper surface of the second silicon plug; further heating the second silicon plug to the second silicon deposition temperature under the second ambient, the second ambient being maintained within the second pressure range; maintaining the second silicon plug and the second insulator surface at the second silicon deposition temperature under the second ambient for a deposition period sufficient to form, in a substantially simultaneous manner, a fourth epitaxial single crystal silicon region having a fourth thickness on the third epitaxial single crystal silicon region and a second substantially amorphous silicon layer having a fifth thickness on the second insulator surface; and further heating the second amorphous silicon layer to the annealing temperature sufficient to induce solid phase epitaxy and convert substantially the entire second amorphous silicon layer to single crystal silicon and form a second single crystal silicon layer.

An alternative to the thermal treatment intended to form single-crystal silicon includes performing the heat treatment at a temperature sufficient to cause formation of polycrystalline silicon from previously unconverted amorphous silicon. Details regarding these various exemplary embodiments of the invention are provided below.

BRIEF DESCRIPTION OF THE DRAWINGS

The invention will become more apparent by describing in detail exemplary embodiments thereof with reference to the attached drawings in which.

Figure 1A:
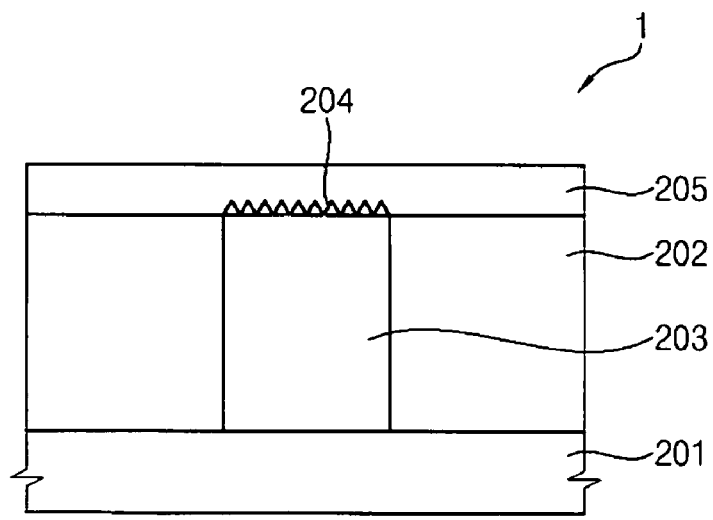
FIGS. 1A and 1B are cross-sectional views of a conventional SPE process in which the reordering of the atoms within an amorphous layer are converted to a single crystal configuration.
Figure 1B:
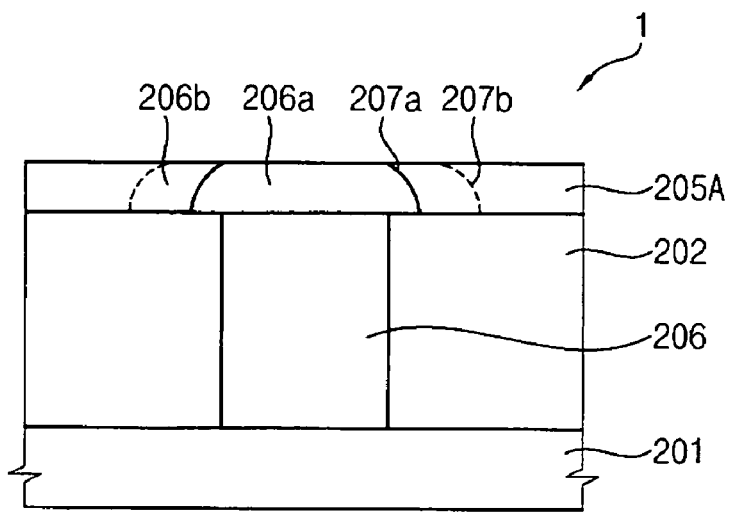

These drawings have been provided to assist in the understanding of the exemplary embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity.

Those of ordinary skill in the art will also appreciate that a range of alternative configurations have been omitted simply to improve the clarity and reduce the number of drawings. Similarly, those of ordinary skill will appreciate that certain of the various structural elements illustrated in the exemplary embodiments shown in, for example, FIGS. 3A–5F, 7, 8, and 9A–10C, may be selectively and independently combined to form other structural configurations useful for manufacturing semiconductor devices without departing from the scope and spirit of this disclosure.

DETAILED DESCRIPTION OF EXEMPLARY EXAMPLES

Figure 3A:
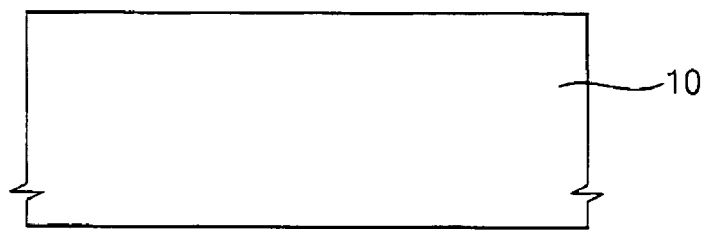
FIGS. 3A and 3B are cross-sectional views corresponding to steps in an exemplary embodiment of the invention.
Figure 3B:
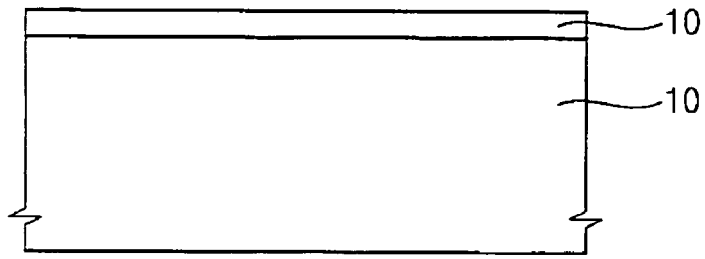

FIGS. 3A and 3B are cross sectional views illustrating a method of forming an epitaxial layer according to an exemplary embodiment of the invention. As illustrated in FIG. 3A, a single crystal silicon layer 10 comprising a substantially oxygen-free silicon is provided as the substrate for the formation of an epitaxial silicon layer. The single crystal silicon layer 10 is not, however, limited to bare silicon wafers, but may encompass silicon substrates, silicon-on-insulator (SOI) substrates, and one or more epitaxial layers formed by applying a selective epitaxial growth process with one or more regions of the single crystal silicon layer 10 forming the seed region or surface.

This exemplary embodiment may also utilize a planarization process, such as chemical mechanical polishing (CMP) process, for planarizing the single crystal silicon layer 10 before initiating the epitaxial process. In addition to, or as an alternative to the CMP process, a surface treatment may be performed on the surface of the single crystal silicon layer 10 using an aqueous HF solution, such as a buffered HF or BHF solution. The aqueous HF solution will tend to remove any native oxide that has formed on the surface of the crystal silicon layer 10 and form a hydrogen passivation layer on the surface of the single crystal silicon layer 10.

As illustrated in FIG. 3B, the single crystal silicon layer 10 can then be exposed to one or more silicon source gas(es), such as silicon hydrate ($Si_xH_y$), silicon hydrochloride ($Si_xH_yCl_z$), and silicon chloride ($Si_xCl_y$). The silicon source gas(es) will be introduced under temperature and pressure conditions that will tend to result in the formation of an epitaxial silicon layer on the surface of the single crystal silicon layer 10. If more than one silicon source gas is utilized, the gases may be applied sequentially, in a single mixture or as a range of mixtures. In most instances, silane ($SiH_4$) may be utilized as a satisfactory silicon source gas.

In addition to the silicon source gas(es), one or more carrier gases, such as a nitrogen ($N_2$), argon (Ar), and/or helium (He), may be supplied to the reaction chamber to acquire the uniform atmosphere in the reaction chamber containing the single crystal silicon layer 10. However, the volume and composition of the carrier gas(es) supplied to the reaction chamber in conjunction with the silicon source gas(es) should be considered so that silicon atoms released by the dissociation of the silicon source gas(es) are allowed to diffuse across the surface of the single crystal silicon layer 10. The diffusion of the silicon atoms on the surface of single crystal layer will typically be deteriorated by introducing the carrier gas(es) into the reaction chamber. Therefore, the volume of non-oxidizing gas(es) incorporating into the reaction chamber should be minimized to obtain epitaxial film quality on the silicon single crystal layer.

For example, depending on the configuration and volume of the reaction chamber and the target epitaxial deposition rate, the silicon source gas(es) may be supplied to the reaction chamber at a rate between about 20 standard cubic centimeter per minute (sccm) to about 200 sccm with the associated carrier gas(es) being supplied at a rate between about 0.01 sccm to about 200 sccm. The silicon source gas(es) and the carrier gas(es) may be supplied to the reaction chamber in a volume ratio of between about 2000:1 to 1:1. As will be appreciated by one of ordinary skill in the art, the volume of the reaction chamber, the deposition pressure and the desired deposition rates will be factors in determining the appropriate flow rates for a particular process. Further, two or more distinct ratios may be utilized during a single epitaxial deposition to provide for greater control over the properties of the resulting film.

When silicon source gas(es) are introduced into the reaction chamber at a temperature below about 350° C., the growth rate of the epitaxial layer 12 tends to be negligible, which would reduce productivity, while at temperatures over about 530° C., growth rate of the epitaxial layer 12 will tend to be so rapid that the final thickness may be difficult to control accurately. Accordingly, although the epitaxial process according to the invention may be operated at other temperatures, the silicon source gas(es) will typically be introduced into the reaction chamber with the silicon substrate being maintained at a temperature between about 350° C. and about 530° C.

In addition, to the extent that the target deposition temperature is above 350° C., the introduction of the silicon source gas(es) and, typically, a smaller volume of carrier gas(es), will be initiated as the silicon substrate temperature reaches about 350° C. during the ramp-up to the target deposition temperature and maintained until the substrate temperature is again below about 350° C. As will be appreciated, the deposition rate may vary to some degree as a function of the deposition temperature, so the deposition thickness control may be improved by controlling the temperature ramp rates between the initiation temperature and the target deposition temperature.

Exemplary temperature ramp rates of between about 5° C./minute and about 10° C./minute, such as, for example, about 7.5° C./minute, may be generally suitable for use in an exemplary epitaxial process. It will be appreciated, however, that both the range and the uniformity of available temperature ramp rates for any particular apparatus will be a function of the heating technique, the heating capacity, the thermal mass being heated and the temperature control technique. As a result, higher and/or lower temperature ramp rates may be more suitable for a given apparatus or process.

In addition to the deposition temperature range, the silicon source gas(es) and carrier gas(es) composition and flow rates, the reaction pressure will affect the epitaxial deposition rate. An exemplary reaction pressure of between about 0.2 Torr to about 0.6 Torr may generally be suitable for epitaxial silicon depositions at temperatures between about 350° C. and about 530° C., such as, for example about 0.4 Torr. As will be appreciated, the range of suitable deposition pressures and the degree of pressure control that may be maintained will tend to vary both from apparatus-to-apparatus and from process-to-process. Further, the deposition pressure need not be constant during a deposition, but may be adjusted to accommodate temperature or gas composition and thereby improve control over and the flexibility of the deposition process.

Initiating the introduction of the silicon source gas(es) into the reaction chamber at a temperature of about 350° C. and at a pressure below about 1 Torr tends to suppress the formation of a silicon oxide layer ($SiO_x$) resulting from any residual oxygen or water that may be in the reaction chamber or absorbed or otherwise present at the single crystal silicon surface. By suppressing or eliminating the formation of silicon oxide on the silicon substrate 10 prior to the deposition of the epitaxial silicon layer 12, the epitaxial layer may be more easily deposited as single crystal silicon and will tend to exhibit reduced resistance between the silicon substrate and the epitaxial layer.

Further, by controlling the ratio of the silicon source gas(es) and the carrier gas(es), e.g., Ar, $N_2$, He, and/or Ne, and the deposition pressure, and thereby controlling the diffusion of silicon atoms on the silicon substrate 10, the structure of the deposited silicon layer 12 can be more easily adjusted to provide for amorphous, polycrystalline or single crystal silicon layers.

Depending on the structure(s) to be formed from the epitaxial silicon layer 12 being deposited, the single crystal silicon structure can provide certain performance and processing advantages. For example, an exemplary epitaxial layer 12 formed as single crystal silicon will tend to exhibit improved crystalline characteristics such as, for example, lower leakage current levels and improved carrier mobility. Further, in certain applications the presence of any significant portion of amorphous silicon in the epitaxial layer may result in device failure, degraded performance or reduced reliability. Thus, by suppressing or eliminating the formation of amorphous silicon the exemplary process can improve device yield and/or reliability.

By suppressing the formation of amorphous silicon in the epitaxial layer 12, the exemplary process can reduce or eliminate processing failures associated with amorphous silicon such as stacking faults, i.e., a deviation in the crystal stacking sequence, and twin boundary phenomena, i.e., the formation of two adjacent crystalline regions that are, structurally, mirror images of each other.

Without being bound by any particular theory, the early and relatively low temperature introduction of the silicon source gas(es) during the epitaxial process apparently acts to suppress or obstruct the reaction of any steam ($H_2O$) or oxygen ($O_2$) that may be at or adjacent a surface of the single crystal silicon layer 10 with the silicon atoms located at or near the exposed surface of the silicon layer. By suppressing or obstructing this reaction, the silicon source gas(es) tend to reduce or prevent the formation of any silicon oxides on the silicon substrate 10.

In particular, a hydrogen passivation layer formed on the surface of the silicon substrate 100 during the aqueous HF processing to remove any accumulated native oxide affords some degree of protection from additional oxidation to a temperature on the order of about 400° C. At about 400° C., however, it appears that as the hydrogen passivation layer remaining on the surface of the single crystal silicon layer 10 breaks down, the presence of the silicon source gas(es) according to the invention results in the formation of a silicon-silicon (Si—Si) bond.

This silicon-silicon bond forming reaction will tend to suppress any competing oxidation reaction that could result between the silicon atoms at or near the surface and any residual steam or oxygen within the reaction chamber. Thus, by preferentially reacting silicon atoms at the surface of the single crystal silicon layer 10 with silicon atoms dissociated from the supplied silicon source gas(es) rather than any residual steam ($H_2O$) or oxygen ($O_2$) that may be adjacent the surface, formation of silicon oxides is suppressed or prevented.

In addition to suppressing the formation of silicon oxides at the interface between the silicon substrate 10 and the epitaxial layer 12, the process conditions outlined above for this exemplary process are generally sufficient that the silicon substrate will act as a seed surface for the formation of a single crystal epitaxial layer 12 that is substantially oxygen-free.

Figure 4A:
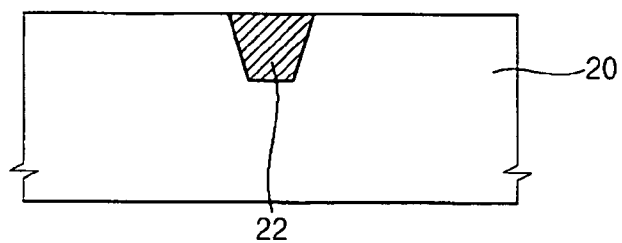
FIGS. 4A–4E are cross-sectional views corresponding to steps in another exemplary embodiment of the invention.

FIGS. 4A through 4E are cross sectional views illustrating another exemplary method for forming a thin silicon layer according to the invention. As illustrated in FIG. 4A, a substrate structure is provided in which the first single-crystal silicon region 22 is provided in an insulating material 20, such as an oxide, nitride, oxynitride and/or a composite material comprising distinct layers of one or more insulating materials. Both the first single-crystal region 22 and the insulating material 20 have an exposed surface with the exposed surfaces being substantially coplanar. The particular structure illustrated in FIG. 4A may generally correspond to a silicon-on-insulator (SOI) substrate.

Alternatively, the first single crystal silicon region 22 may, for example, incorporate an epitaxial layer 24 formed by a selective epitaxial growth (SEG) process using the exposed surface regions of an underlying single crystal silicon as an epitaxial seed region. As will be appreciated by those of skill in the art, the structure generally illustrated in FIG. 4A may be the result of a series of deposition, patterning and/or etching processes in combination with a CMP process to produce a generally planar surface. Depending on the composition of the insulating material 20, an aqueous HF solution may be utilized to remove native oxide from the surface of the first single-crystal region 22, but caution may be necessary to prevent or suppress the simultaneous removal of an upper portion of the insulating material 20 that would tend to lower the exposed insulating surface relative to that of the first single-crystal region 22. The use of an aqueous HF solution or other surface treatment that will tend to produce a hydrogen passivation layer on the surface of the substrate, including the insulating material 20 can suppress oxidation at temperatures below which the silicon source gas(es) are introduced into the reaction chamber.

Figure 4B:
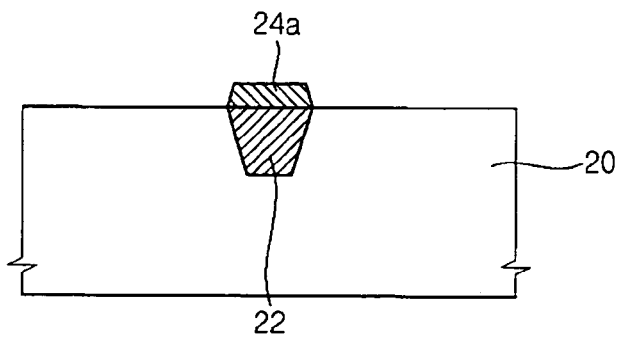
Figure 4C:
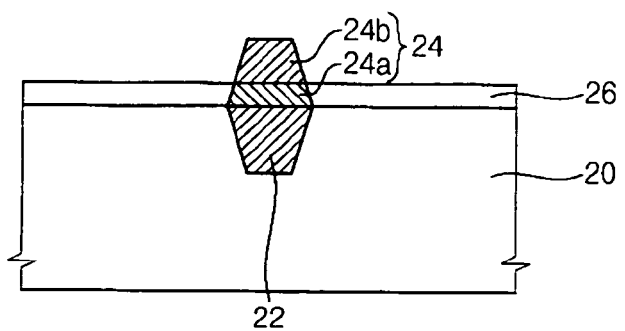

As illustrated in FIGS. 4B and 4C, one or more silicon source gas(es) selected from silicon hydrates, silicon hydrochlorides and silicon chlorides are introduced into a reaction chamber in which the cleaned substrate has been positioned. Because the silicon source gas(es) will tend to deposit their silicon atoms on the exposed surface of the silicon region 22 in a generally ordered, i.e., single-crystal, manner. As a result, an epitaxial facet 24a will be formed that extends upwardly from the exposed silicon surface of silicon region 22. By initiating the introduction of the silicon source gas(es) to the substrate at a temperature below or about 350° C., the formation of native silicon oxides on the exposed silicon surface of silicon region 22 can be suppressed while permitting the formation of a single-crystal region 24a on the silicon region.

As illustrated in FIG. 4C, the silicon source gas(es) will tend to start depositing the epitaxial region 24a on the surface of the silicon region 22 at about 350° C. However, at this temperature, there is very limited silicon deposition on the surrounding surface of the insulating material 20. According to this exemplary method, the silicon source gas(es) will be supplied at a first quantity or flow rate while the substrate temperature is being increased from a first temperature, typically between about 350° C. and about 530° C., to a second temperature during which the first epitaxial layer 24a will be formed.

With a first deposition temperature between about 350° C. and about 530° C., the epitaxial layer formation will generally be limited to exposed silicon surfaces. Indeed, while the deposition temperature remains below about 500° C., there will be relatively little deposition of a silicon layer on the surrounding surface of the insulating material 20. In particular, when the second temperature is below about 500° C., the growth of the amorphous silicon layer 26 will tend to be suppressed.

Figure 2:
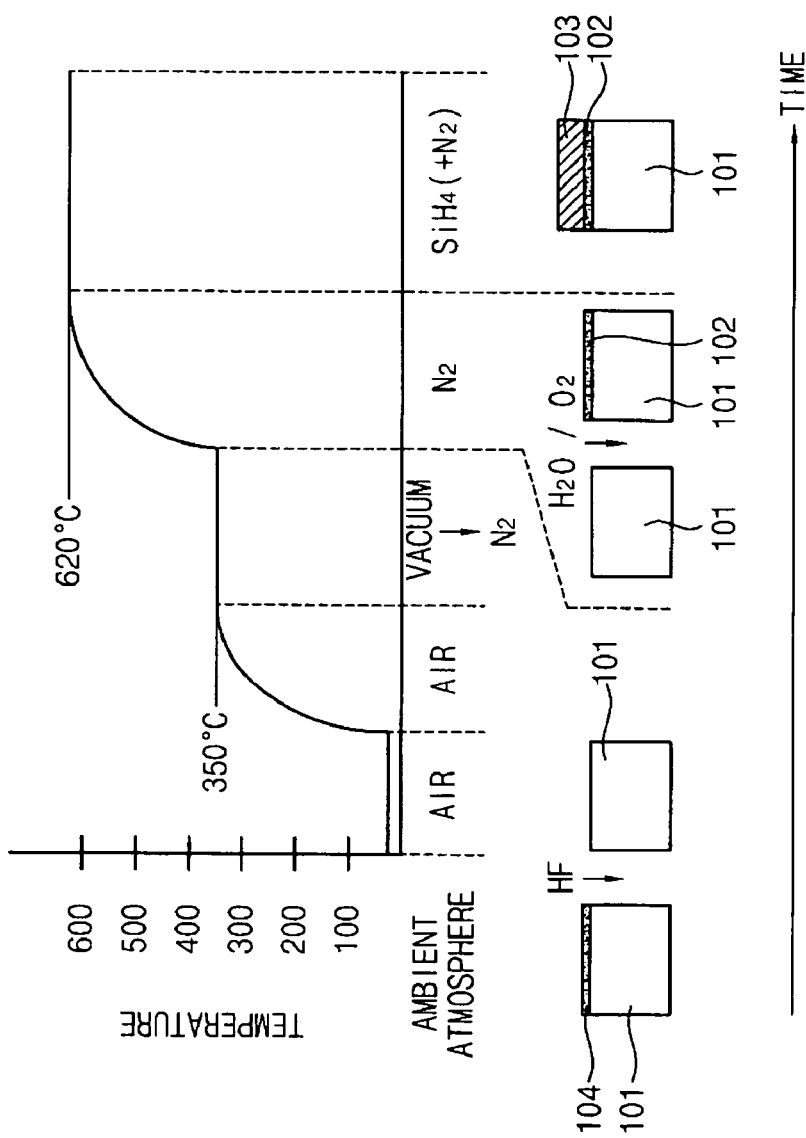
FIG. 2 is a chart illustrating the temperature profile and the sequential substrate conditions in a conventional SPE process.

However, as illustrated in FIG. 2C, when the deposition temperature increases above 500° C. for at least a portion of the deposition process, and particularly above about 550° C., the deposition rate of a silicon layer on the surface of the insulating material 20 will increase to produce a silicon layer 26 as additional single crystal silicon 24b is deposited on the epitaxial facet 24a. Depending on the deposition conditions, silicon layer 26 can have a generally amorphous or generally polycrystalline configuration. The polycrystalline orientation is not preferred, however, because the presence of the various silicon crystal grains obstructs the use of solid phase epitaxy (SPE) processes for forming a single-crystal silicon layer. As a result, the silicon deposition process is generally conducted above about 350° C. and below about 550° C. if the intent is to form single-crystal silicon using SPE.

As will be appreciated, in light of the interest in suppressing the deposition of polycrystalline silicon, the second temperature will generally be selected to prevent the substrate from reaching 550° C. during the deposition process. Those of ordinary skill in the art will appreciate that differences between the various styles and configurations of the deposition apparatus, the degree of control over this deposition temperature will vary somewhat.

For instance, in some reactors the temperature control may be fairly good, e.g., able to reach and maintain a target temperature without exceeding the target temperature by more than about 5° C. or less, and, consequently may allow the deposition process to be operated at second temperature not much below 550° C., e.g., 540° C., with satisfactory results. For equipment that does not exhibit such fine temperature control, or if a larger safety margin is preferred, the second temperature can be set within a range between about 500° C. and about 540° C., for example 530° C., to provide for a reasonable deposition rate while still suppressing or eliminating the formation of polycrystalline silicon on the insulating surfaces. As in the previous exemplary embodiment, the pressure within the reactor chamber may be maintained below about 1 Torr or, more typically, between about 0.4 and 0.6 Torr.

Accordingly, when the source gas(es), deposition temperature range and deposition pressure(s) are not within the appropriate ranges, the desired formation of single crystal silicon will be compromised by the formation of silicon oxides or the formation of a polycrystalline layer that will interfere with the subsequent SPE process. As a result, the silicon layers and structures resulting from such processes will tend to exhibit degraded crystal characteristics, lower yield and/or reduce the reliability of the resulting semiconductor devices.

As illustrated in FIG. 4C, when the deposition parameters are appropriately set, a second epitaxial layer 24b is grown on the first epitaxial layer 24a as the amorphous silicon layer 26 is being formed on the insulating layer pattern 20. The silicon source gas(es) may be supplied at a second quantity or flow rate during the portion of the deposition conducted at or near the second temperature to support the increased need for Si atoms to support the formation of both the second epitaxial layer 24b and the amorphous silicon layer 26.

The degree to which the silicon source gas flow may be increased to support the formation of the amorphous layer will tend to vary with the ratio of the silicon and insulator surface areas. It is suspected, however, that the second quantity or flow rate may typically be set at between about two (2) to about five (5) times as much as a first quantity that is sufficient to support formation of an epitaxial layer on a silicon surface to maintain satisfactory deposition rates of both the single crystal silicon and the amorphous silicon. This flow rate ratio may reflect the relative surface areas of silicon and insulating materials exposed on the surface of the substrate. It is believed that generally, a ratio on the order of about 2.5 through about four (4) times will be sufficient in most instances. However, there may be instances in which the flow rates are set outside this ratio range to obtain a desired range of relative deposition rates for particular device designs, classes, or processes.

As illustrated in FIG. 4B, after the formation of the single-crystal epitaxial region 24, which includes both the first epitaxial layer 24a and the second epitaxial layer 24b, and the amorphous silicon layer 26 is substantially complete, the ambient temperature may be decreased from the second temperature to the first temperature to terminate the deposition. As with the ramp up rate, it is preferred that the ramp down rate be relatively constant in order to improve the thickness control for the resulting layers. An exemplary ramp down rate may be on the order of between about 5° C./minute and about 10° C./minute, and in particular, between about 5° C./minute and about 8° C./minute. Those of ordinary skill in the art will, of course, appreciate that the ramp down rate that may be achieved will be a function of parameters such as the thermal mass being cooled, cooling technique, and temperature control technique.

As the ambient temperature is decreased to slow and ultimately terminate the deposition process, an inert gas such as nitrogen, helium, argon, or a mixture of such gases, may be introduced into the reaction chamber for replacing at least the silicon source gas even before the temperature of the substrate has been decreased from the maximum deposition temperature. The introduction of the inert gas will tend both to purge impurities from the reaction chamber and terminate the deposition. Further, once the deposition process has been terminated, the substrate, with its newly deposited silicon layers, may be heated to a temperature sufficient to induce solid phase epitaxy (SPE). The manner in which the substrate is heated from the second temperature to the SPE target temperature may be utilized to provide some post deposition annealing treatment.

Figure 4D:
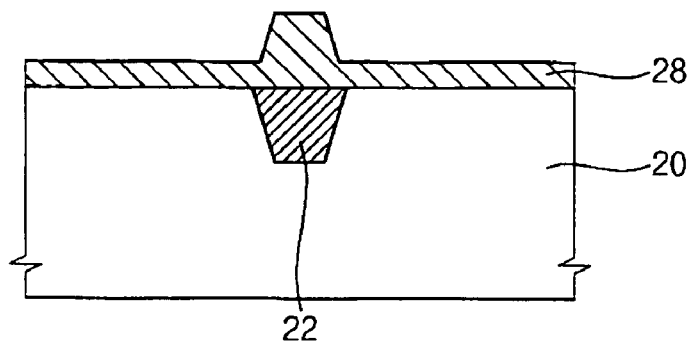

As illustrated in FIG. 4D, the organization of the deposited amorphous silicon layer 26 is transformed through SPE into a single-crystal structure, so that the epitaxial layer 24 and the amorphous silicon layer 26 are combined and transformed to produce a second single-crystal silicon layer 28a. As indicated, the original structure of the amorphous silicon layer 26 may be transformed via SPE into a single-crystal structure using the epitaxial layer 24, formed on the first single-crystal silicon region 22, as the seed layer.

The solid phase epitaxy (SPE) process does not tend to be easily or uniformly initiated at temperatures below about 570° C., but when the substrate temperature exceeds about 650° C., the amorphous silicon will tend to convert to a polycrystalline silicon. As a result, the SPE process is typically performed at a temperature between that at which SPE activity may be detected and a temperature sufficient to spontaneously produce polycrystalline silicon from the amorphous silicon layer.

Accordingly, the SPE heat treatment may be successfully performed at a temperature within a range of from about 570° C. to about 650° C. In light of the consequences associated with exceeding the upper limit, it may be prudent to operate within a lower range of perhaps about 580° C. to about 620° C., perhaps with a target temperature of about 600° C. The SPE process may be conducted in the reaction chamber or the substrates may be moved to a conventional furnace for the additional thermal processing, thereby freeing the reactor to deposit silicon layers on additional substrates.

Figure 4E:
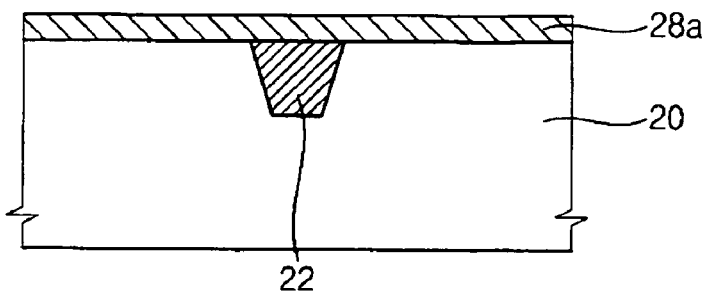

As illustrated in FIG. 4E, after the second single crystal silicon layer 28a has been formed, the surface of the second single crystal silicon layer 28a may be polished or planarized by, for example, utilizing a CMP process. The surface of the second single-crystal silicon layer 28a can exhibit a degree of roughness as a result of the epitaxial layer that renders the silicon layer unsuitable for direct gate processing. The use of the CMP process, however, can be sufficient to remove or reduce this roughness to form a polished second single-crystal silicon layer 28 suitable for additional processing.

As will be appreciated, the post-deposition thermal processing may be conducted in several sequences and may utilize the same basic apparatus or may be transported between various pieces of equipment in order to receive the desired processing and/or improve the efficient use of the various machines. In particular, after the deposition is substantially complete and the flow of the silicon source gas has been terminated, the substrate can be heated directly into a temperature range sufficient to induce SPE and thereby form the single-crystal layer 28a.

By utilizing the disclosed method according to the exemplary embodiments, stacked single-crystal silicon layers may be easily formed, thus providing for the manufacture of semiconductor devices that include such a stack structure while providing the noted improvements in leakage current and/or carrier mobility associated with the improved quality of the single-crystal silicon being formed.

FIGS. 5A through 5F and FIG. 7 are cross sectional views illustrating an exemplary method for forming a thin silicon layer according to a third embodiment of the present invention.

Figure 5A:
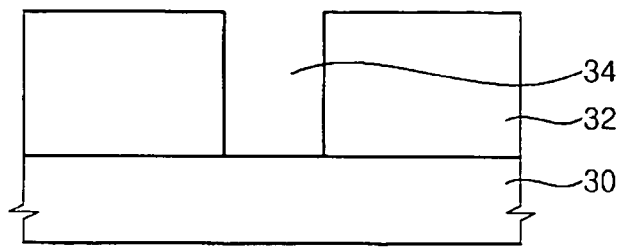
FIGS. 5A–5F are cross-sectional views corresponding to steps in another exemplary embodiment of the invention.
Figure 5B:
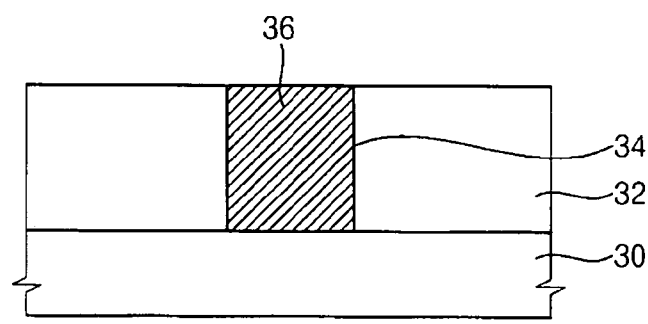
Figure 5C:
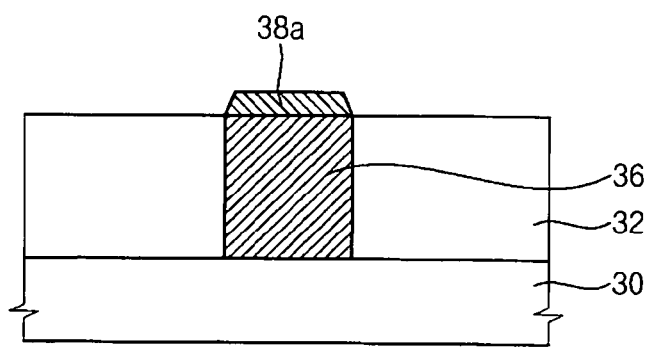
Figure 5D:
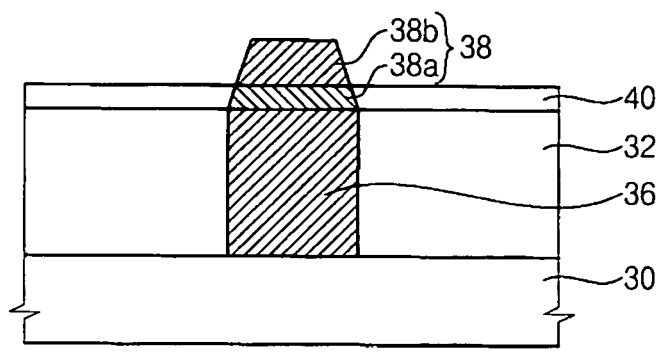
Figure 5E:
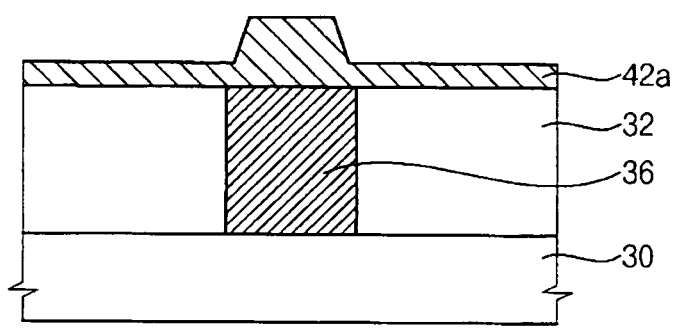
Figure 5F:
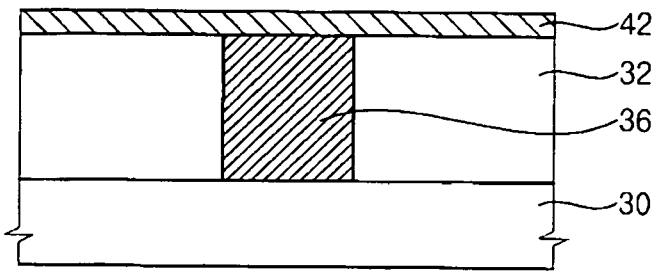
Figure 6:
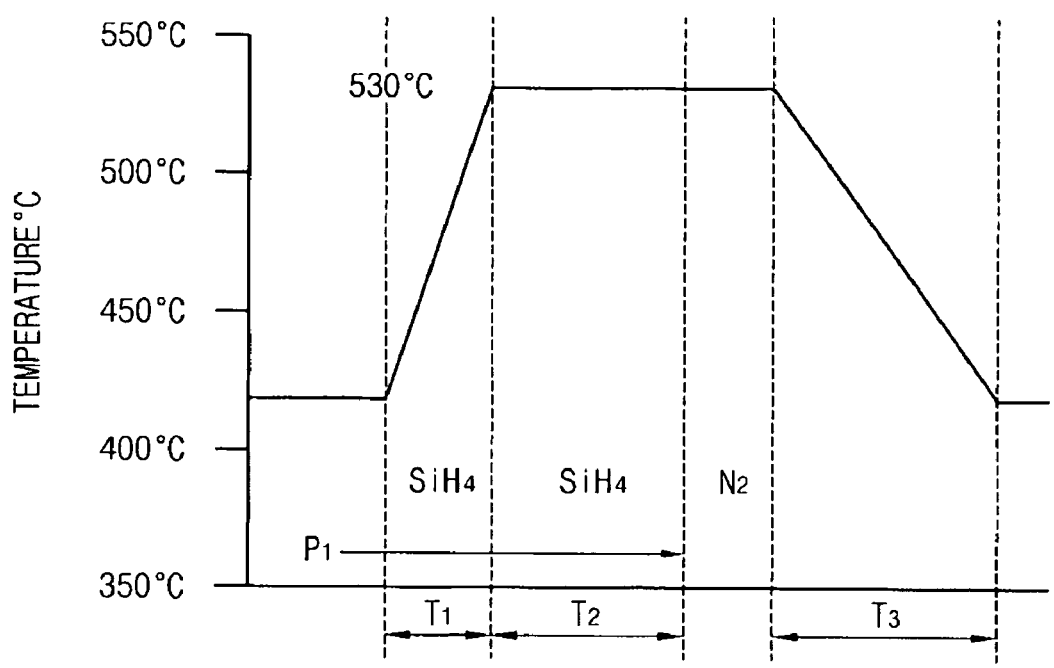
FIG. 6 is a chart illustrating the temperature profile and the sequence of process conditions in a method according to an exemplary embodiment of the invention.

FIG. 6 is a schematic diagram illustrating certain processing steps associated with the disclosed method for forming a thin silicon layer according to a third embodiment of the invention. FIG. 6, illustrates the time dependent changes in processing temperature and other parameters associated with the method illustrated in FIGS. 5A–5F.

As illustrated in FIG. 5A, an insulating layer 32 is formed on a single-crystal silicon substrate 30 and an opening 34 is then formed through the insulating layer to form an insulating pattern and to expose a surface portion of the first single crystal silicon layer 30. Exemplary embodiments of the first single crystal silicon layer 30 include both silicon substrates and silicon-on-insulator (SOI) substrate. Alternatively, the first single crystal silicon layer 30 may include one or more epitaxial layers formed using a selective epitaxial growth (SEG) process using the exposed single crystal silicon surface as a seed region. In this exemplary embodiment, the silicon substrate is illustrated as incorporating a first single crystal silicon layer 30 with an insulating layer pattern 32 formed from a material such as an oxide.

Because the silicon substrate may be used as the first single crystal silicon layer 30, various semiconductor structures, such as gate electrodes, metal wiring patterns, capacitors, resistors, and logic devices, may be disposed on the first single crystal silicon layer 30. The particular structures recited above are exemplary only and it will be appreciated that any other structure or structures incorporated in a semiconductor design could be provided on the first single crystal silicon layer 30 if appropriate.

As illustrated in FIG. 5B, a selective epitaxy growth process is then performed using the first single crystal silicon layer 30 as the seed region. This selective epitaxy process may be performed at one or more temperatures within a range of from about 600° C. to about 900° C. In an exemplary SEG process, a first seed layer 36 is grown at about 800° C. from the surface of the first single crystal silicon layer 30 partially exposed through the opening portion 34. This first seed layer 36 will have a single crystal structure identical to that of the first single crystal silicon layer 30 on which it is grown.

Figure 7:
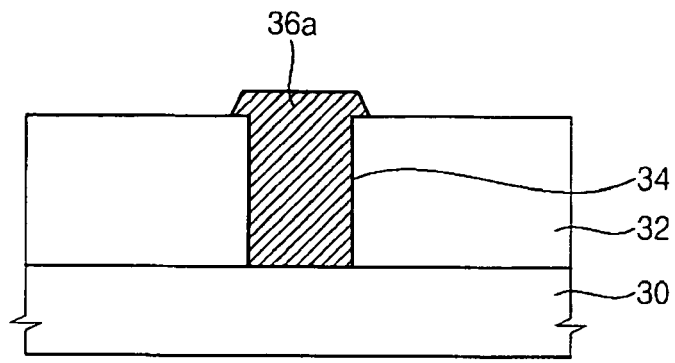
FIG. 7 is a cross-sectional view of an optional intermediate step in a method according to the invention.

As illustrated in FIG. 7, when the first seed layer 36a extends above a plane defined by the insulating material 34, a planarization process such as a CMP process may be used to remove an upper portion of the first seed layer 36a to produce a generally planarized surface on which the entrance of the opening portion 34 is exposed. A surface treatment using, for example, the aqueous HF solution may be performed after on the first seed layer 36 for removing the native oxide layer from the exposed silicon surfaces and form a hydrogen passivation layer on at least the silicon surfaces.

As illustrated in FIGS. 5C and 5D, one or more silicon source gas(es) may be introduced into a reaction chamber in which the substrate, including the first seed layer 36, has been placed. Examples of silicon source gases include silicon hydrates ($Si_xH_y$), silicon hydrochlorides ($Si_xH_yCl_z$), silicon chlorides ($Si_xCl_y$) and mixtures thereof. In most instances, it is believes that silane ($SiH_4$) will provide suitable results when used as the silicon source gas.

As illustrated in FIGS. 5C and 5D, supplying the silicon source gas(es) into the reaction chamber holding the substrate on which the first seed layer 36 is exposed will tend to prevent the formation of a native oxide layer on the surface of the first seed layer 36, thus allowing the epitaxial layer 38a to be formed on the first seed layer 36 without an intervening native oxide layer. Addition deposition at higher deposition temperatures as detailed above will tend to form an additional epitaxial layer 38b on epitaxial layer 38a and an amorphous silicon layer 40 on the insulating layer pattern 32.

In more detail, a first epitaxial layer 38a is grown on the first seed layer 36 as shown in FIG. 5C. One or more silicon source gases are supplied at a first flow rate while the temperature of the substrate is increased from a first temperature to a second temperature that will be suitable for growing the first epitaxial layer 38a. The temperature increase from the first temperature to the second temperature and the first quantity are generally consistent with those described above in connection with FIGS. 4A to 4E.

As illustrated in FIG. 6, the silicon source gas(es) having a flow rate $F_1$ are supplied to the reaction chamber as the substrate temperature is ramped, at a temperature ramp rate of, for example, about 7.5° C./minute, from a temperature of about 400° C. to about 530° C. In addition, the pressure within the reaction chamber is generally maintained at a target pressure, $P_1$, which may be about 0.3 Torr to 0.5 Torr, for a first time period $t_1$ of about 20 minutes.

As described above, supplying the silicon source gas(es) at the first flow rate $F_1$ and initiating the flow of the silicon source gas(es) at a relatively low temperature, e.g., 350° C. to about 400° C., will suppress or eliminate the reformation of any silicon oxide layer on the first seed layer 36, thus allowing the formation of the first epitaxial layer 38a on the first seed layer 36 as single-crystal silicon. Subsequently, a second epitaxial layer 38b is grown on the first epitaxial layer 38a as shown in FIG. 3D, and as a result, the amorphous silicon layer 40 is formed on the insulating layer pattern 32.

The silicon source gas is supplied in a second flow rate $F_2$ at the second temperature for forming the second epitaxial layer 38b and the amorphous silicon layer 40. The second temperature and the ratio between the first $F_1$ and second flow rate $F_2$ will generally correspond to that described above in connection with FIGS. 4A–E. In particular, the second flow rate $F_2$ will tend to be higher, perhaps significantly higher, than the first flow rate $F_1$, in order to support the greater area of the substrate on which the epitaxial silicon is being deposited.

Therefore, as shown in FIG. 5, the silicon source may be supplied at a second flow rate $F_2$ that is about three times that of the first flow rate $F_1$ and may supplied at a temperature of about 530° C. in the present embodiment. In addition, the pressure $P_1$ may continue to be maintained at about 0.4 Torr. These deposition conditions may be maintained for the second time period $t_2$, which may range from about 25 minutes to about 60 minutes to form the second epitaxial layer 38b and the amorphous silicon layer 40 to sufficient thickness.

After the epitaxial layer 38, which includes both the first epitaxial layer 38a and the second epitaxial layer 38b, and the amorphous silicon layer 40 are formed, the substrate temperature may be decreased from the second temperature to the first temperature at a ramp down rate of between about 4° C./minute and about 10° C./minute.

Accordingly, as shown in FIG. 6, the temperature may be ramped down at a rate of about 5.5° C./minute from about 530° C. to about 400° C. during a time period $t_3$ of about 25 minutes. As also indicated in FIG. 6, a nitrogen purge may be used to begin removing the silicon source gas(es) and any other carrier gas(es) before starting to reduce the substrate temperature from that used during the second stage of the deposition.

As illustrated in FIG. 5E, the amorphous silicon layer 40 may then be transformed into a single crystal structure utilizing a SPE process whereby a second single crystal silicon layer 42a is obtained from the combination of epitaxial layer 38 and the amorphous silicon layer 40 as detailed above. The amorphous silicon layer 40 will typically be transformed into a single-crystal structure using a SPE process at a temperature between about 570° C. and about 650° C. Alternatively, the second temperature described with reference to FIGS. 5C and 5D may be directly increased to a temperature sufficient to initiate and maintain the SPE process.

As illustrated in FIG. 5F, after the second single-crystal silicon layer 42a is formed, a surface of the second single-crystal silicon layer 42a may be planarized by using, for example, a CMP process, to form a polished second single-crystal silicon layer 42. Accordingly, the epitaxial layer 38 is grown on the first seed layer 36 while a silicon source gas is being supplied, thereby tending to prevent the formation of a native oxide layer or coating on the first seed layer 36.

Figure 8:
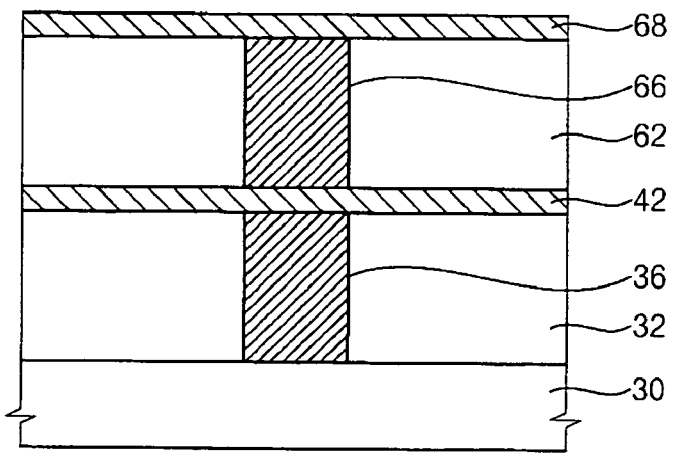
FIG. 8 is a cross-sectional view of a stacked silicon structure that may be formed utilizing an exemplary method according to the invention.

As illustrated in FIG. 8, the second single-crystal silicon layer 42 may be configured and utilized as a channel layer, e.g., an active region of a transistor. The other semiconductor structures typically associated with and/or necessary for the operation of a transistor, e.g., a gate electrode, conductive patterns, such as a metal wiring, may be formed on the second single-crystal silicon layer 42 to form and/or connect a plurality of semiconductor devices, such as logic or memory devices.

A second insulating layer 62 having a structure generally corresponding to that of the first insulating layer 32 may then be formed on the second single-crystal silicon layer 42, and a third single-crystal silicon layer 68 generally having the same structure as that of the second single-crystal silicon layer 42 may then be formed above the second single-crystal silicon layer. This process sequence may be repeated to produce an $n^{th}$ insulating layer pattern, an $n^{th}$ seed layer and an $(n+1)^{th}$ single-crystal silicon layer (wherein n is a whole number and is greater than or equal to 4) by generally repeating the basic process steps used to form the previous single-crystal silicon structures. The completed single-crystal silicon structure may include, therefore, a plurality of single-crystal silicon layers separated by a plurality of insulating layers and interconnected by a plurality of seed layers.

According to the exemplary embodiments, stacked single-crystal silicon layers may easily formed, thus permitting the manufacture of semiconductor devices that incorporate such stack structures. When a structure of the amorphous silicon layer is transformed into a single crystal structure according to the exemplary embodiments, impurities and defects such as those associated with a native oxide layer are generally suppressed or eliminated from the surface of the seed layer, thereby allowing the adjacent amorphous silicon layer to be more easily transformed into the single-crystal structure.

Further, processing and/or reliability failures associated with residual portions of or the incomplete conversion of the amorphous silicon layer also tend to be reduced or eliminated by the exemplary methods. Examples of processing failures associated with amorphous silicon layer include stacking faults, which refers to deviations in the crystal stacking sequence, or a twin boundary phenomenon, which refers to the separation of two adjacent crystalline regions that are, structurally, mirror images of each other. Accordingly, the epitaxial layer formed in accord with the exemplary embodiment exhibits improved crystal characteristics, thus tending to reduce leakage current and/or improve the mobility of electrons or holes through the device, i.e., improved carrier mobility.

Figure 9A:
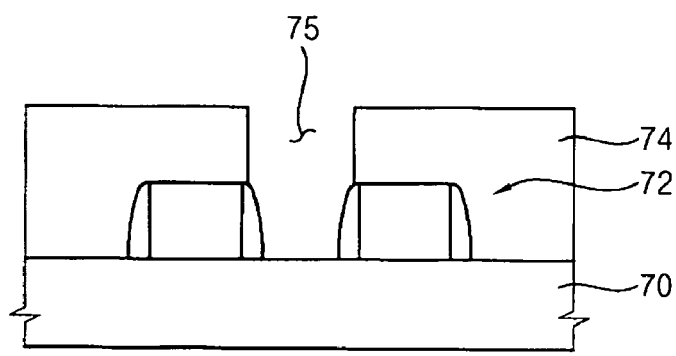
FIGS. 9A–9D are cross-sectional views corresponding to steps in another exemplary embodiment of the invention.

FIGS. 9A through 9D are cross sectional views illustrating certain processing steps of a method of manufacturing a semiconductor device according to another exemplary embodiment of the present invention. As illustrated in FIG. 9A, an insulating layer pattern 74 having an opening 75 that exposes a portion of the surface of a lower layer 70 is formed on the substrate. Although the upper surface of the lower layer 70 will be silicon, the substrate may be a silicon substrate, a silicon-on-insulator substrate or one or more epitaxial layers deposited on a base substrate. The insulating layer pattern 74 includes an insulating interlayer that may comprise one or more layers of an oxide and/or other suitable insulating materials.

As illustrated in FIG. 9A, the silicon substrate on which a gate pattern 72 is formed is used as the lower layer 70. The insulating layer pattern 74 includes an opening portion 75 that exposes a portion of the silicon substrate between the gate patterns 72. The insulating layer pattern 74 may, for example, be formed by depositing or forming an insulating layer the substrate, patterning the insulating layer with a conventional photolithographic process, and then etching the portions of the insulating layer exposed by the photoresist pattern.

Figure 9B:
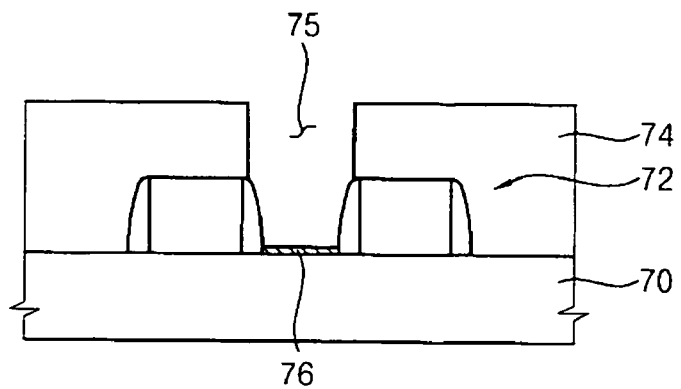

As illustrated in FIG. 9B, a silicon source gas is supplied to a heated substrate including the insulating layer pattern 74. Examples of the silicon source gas include silicon hydrates ($Si_xH_y$), silicon hydrochlorides ($Si_xH_yCl_z$), silicon chlorides ($Si_xCl_y$) and mixtures thereof. In most instances, silane ($SiH_4$) gas may be used successfully as the main silicon source gas. As a result of being exposed to the silicon source gas under appropriate temperature and pressure conditions, a first epitaxial layer 76 will be grown on the portion of the surface of the lower layer 70, e.g., a silicon substrate, that is exposed through the opening portion 75, so that native oxide will be suppressed or prevented from forming on the surface exposed within opening portion 75.

Figure 9C:
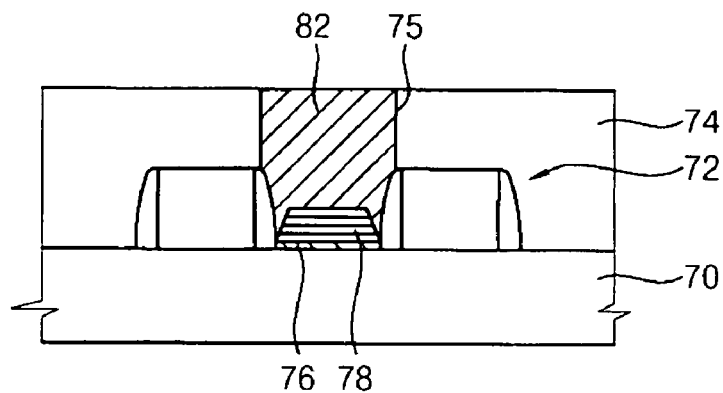

As illustrated in FIG. 9C, a silicon source gas may then be supplied to the substrate that includes the first epitaxial layer 76 under temperature and pressure conditions sufficient to cause the selective formation of an epitaxial single-crystal layer exposed silicon surfaces and thereby form a second epitaxial layer 78 on the first epitaxial layer 76. Depending on the selection of process temperatures and time periods, a silicon layer 80 may also be formed on the sidewalls of the openings 75 through the insulating layer pattern 74. When formed at a temperature of below about 400° C., the deposited silicon layer 80 tends to be amorphous and be formed very slowly, but when formed at a temperature of over 550° C., the silicon layer tends to have a polycrystalline silicon structure that will tend to interfere with subsequent efforts to convert the silicon to single-crystal silicon through a SPE process and is, therefore, generally undesirable.

Therefore, silicon layer 80 is preferably formed at a temperature between about 400° C. and to 550° C., and generally in the higher part of that range of, for example, about 450° C. to about 540° C., in order to achieve an acceptable deposition rate while still maintaining the amorphous structure in the silicon layer 80. A suitable amorphous layer may be formed at a temperature of about 530° C. with the silicon source gas(es) being supplied at a pressure within a range of about 25 Pa (about 0.2 Torr) to about 150 Pa (about 1.13 Torr).

Figure 9D:
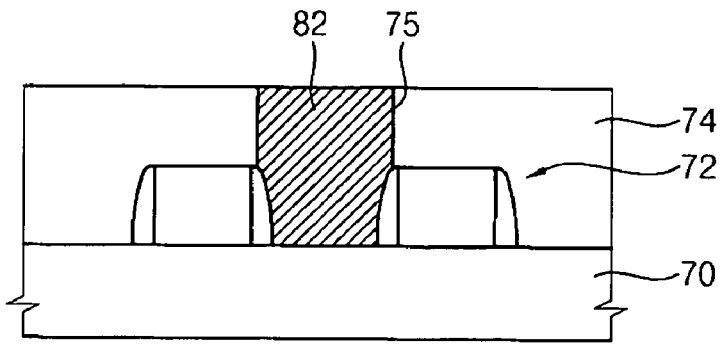

As illustrated in FIG. 9D, the amorphous silicon layer 80 may be transformed into a single-crystal structure utilizing the same basic SPE process outlined above to obtain a single-crystal silicon layer 82 from the combination of the first and second epitaxial layers 76, 78 and the conversion of the silicon layer 80 from an amorphous to a single-crystal structure. This exemplary embodiment may also be utilized in the manufacture of semiconductor devices including various kind of patterns and layers as would be known to one of the ordinary skill in the art.

Figure 10A:
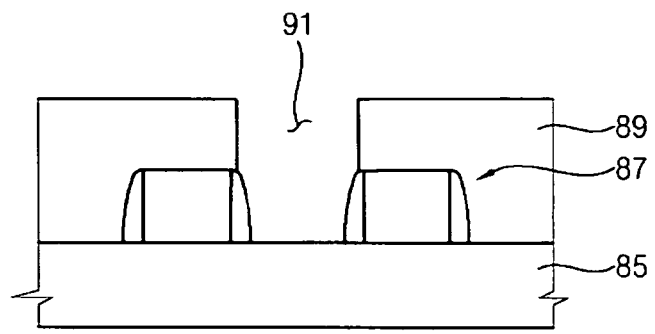
FIGS. 10A–10C are cross-sectional views corresponding to steps in another exemplary embodiment of the invention.
Figure 10B:
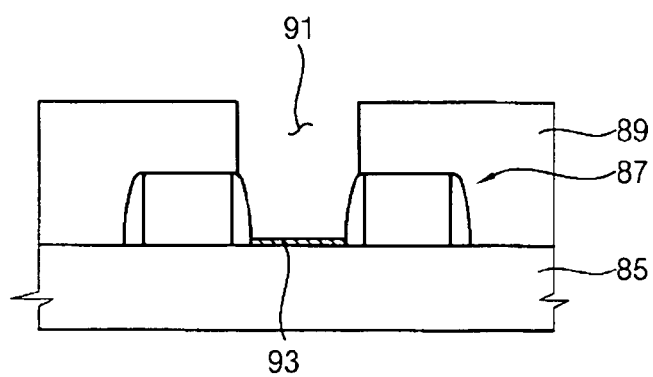
Figure 10C:
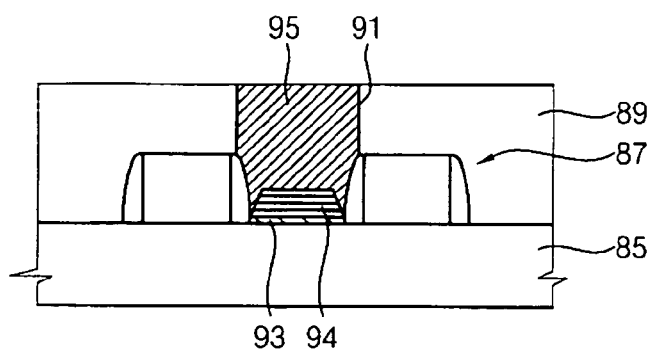
Figure 11A:
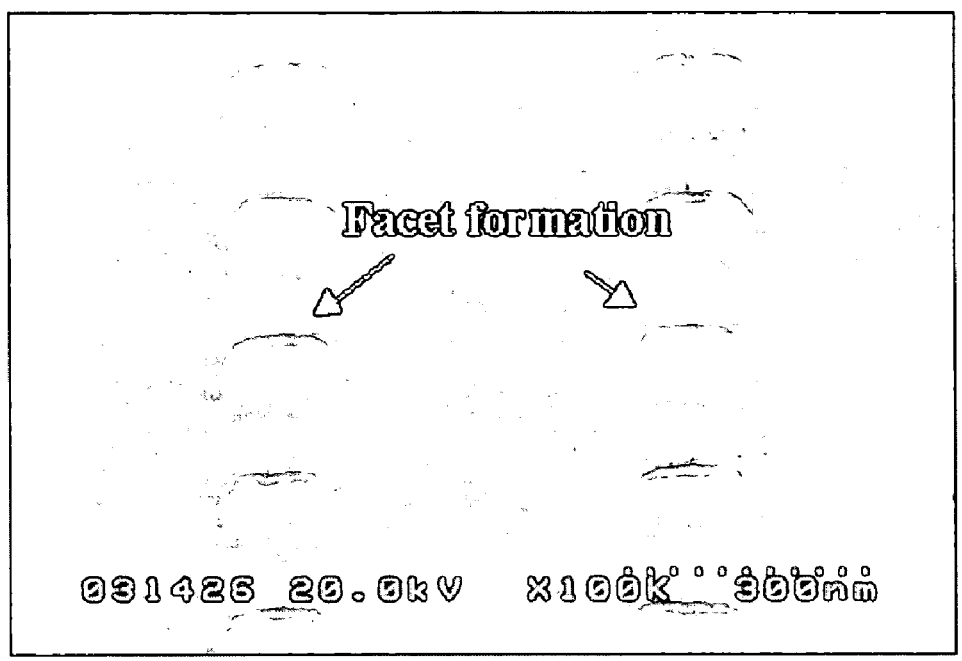
FIGS. 11A and 11B are SEM micrographs illustrating the improvement in epitaxial quality provided by an exemplary method according to the invention, FIG. 11A, as compared to the same structures produced by a conventional deposition method.
Figure 11B:
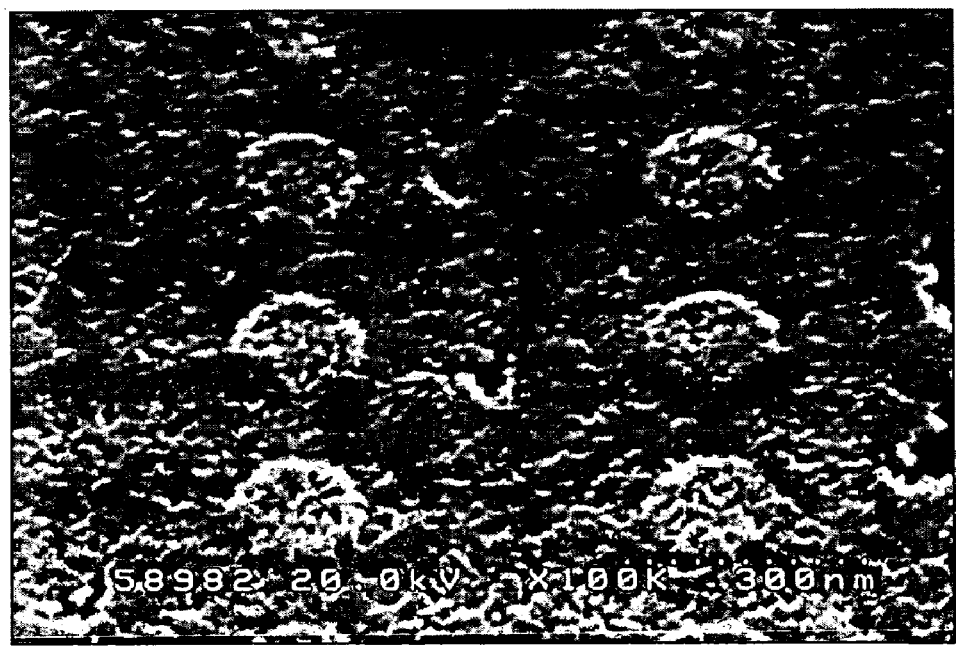

FIGS. 10A through 10C are cross sectional views illustrating certain processing steps of a method of manufacturing a semiconductor device according to another exemplary embodiment of the present invention. As illustrated in FIG. 10A, an insulating layer pattern 89 having an opening 91 that partially exposes a surface of a lower layer 85 may be formed on a lower layer utilizing a process similar to that described above in connection with FIGS. 9A–9D. Accordingly, the silicon substrate on which a gate pattern 87 has been formed may serve as the lower layer 85.

As illustrated in FIG. 10B, a first epitaxial layer 93 may then be grown on an exposed portion of the lower layer 85, for example a silicon substrate, accessible through the opening portion 91. The formation of the epitaxial layer 93 tends to suppress or eliminate the subsequent formation of a native oxide layer on the portion of lower layer 85 that was exposed through the opening portion 91.

As illustrated in FIG. 10C, the second epitaxial layer 94 and a polysilicon layer 95 may subsequently be formed in the opening portion 91 in which the first epitaxial layer 93 was previously formed by a thermal cracking of a silicon source gas. When formed at a temperature of below 500° C., the polysilicon layer 95 forms very slowly, but when the polysilicon layer 95 is formed at a temperature of above about 650° C., the silicon source gas tend to be "cracked" too rapidly with the uniformity of the resulting polysilicon layer tending to be degraded as a result.

Accordingly, a suitable polysilicon layer 95 may be formed at a temperature between about 500° C. and 650° C. by a process that involves the thermal cracking of a silicon source gas or gases. Depending on the apparatus and the control technique, narrow ranges of, for example, about 550° C. to about 620° C. may provide both an acceptable formation rate and acceptable uniformity. Again, depending on the particular apparatus and the capabilities of the temperature controller, running the polysilicon formation toward the higher end of the temperature range, e.g., at about 600° C. can be utilized to produce a satisfactory polysilicon layer under process pressures ranging from about 25 Pa (about 0.2 Torr) to about 150 Pa (about 1.13 Torr).

After the polysilicon layer 95 has been formed to a desired thickness on the insulating layer pattern 89, the upper portion of the polysilicon layer 95 may be removed using a CMP process or other suitable planarization method. The upper portion of the polysilicon layer 95 and a minor upper portion of the insulating layer pattern 89 may be removed to form a substantially planar surface on which an upper edge of the opening 91 is exposed and leaving the opening filled with the remaining portion of the polysilicon layer 95. This remaining portion of the polysilicon layer 95 functions as a plug that is, or may be, electrically connected to a bit line or a lower electrode of a capacitor formed in a subsequent process.

According to this exemplary embodiment, the epitaxial layer 93 is formed before forming the polysilicon layer 95 in order to suppress the formation of any native oxide on the exposed surface of the lower layer. As a result, contact resistance attributable to the presence of a native oxide layer is reduced in semiconductor devices manufactured according to this exemplary embodiment and the electrical characteristics of the resulting semiconductor devices may be improved.

Although the invention has been described in connection with certain exemplary embodiments, it will be evident to those of ordinary skill in the art that many alternatives, modifications, and variations may be made to the disclosed structures and methods in a manner consistent with the detailed description provided above. Also, it will be apparent to those of ordinary skill in the art that certain aspects of the various disclosed exemplary embodiments could be used in combination with aspects of any of the other disclosed embodiments or their alternatives to produce additional, but not herein illustrated, embodiments incorporating the claimed invention but more closely adapted for an intended use or performance requirements. Accordingly, it is intended to embrace all such alternatives, modifications and variations that fall within the spirit and broad scope of the appended claims.

What is claimed is:

1. A method of forming a single crystal silicon structure comprising:
   providing a single crystal silicon surface;
   heating the silicon surface to a first temperature of no more than about 350° C. under a first ambient and within a first pressure range;
   further heating the silicon surface from the first temperature to a first silicon deposition temperature between about 350° C. and about 530° C. under a second ambient, the second ambient being maintained within a second pressure range, the second ambient including a silicon source gas and a non-oxidizing carrier gas; and
   maintaining the silicon surface at the first silicon deposition temperature under the second ambient for a deposition period sufficient to form a first epitaxial single crystal silicon region having a first thickness on the silicon surface.

2. A method of forming a single crystal silicon structure comprising:
   proviving a single crystal silicon surface that is substantially free of silicon oxide;
   heating the silicon surface to a first temperature of no more than about 350° C. under a first ambient and within a first pressure range;
   further heating the silicon surface from the first temperature to a first silicon deposition temperature between about 350° C. and about 530° C. under a second ambient, the second ambient being maintained within a second pressure range, the second ambient including a silicon source gas and a non-oxidizing carrier gas; and
   maintaining the silicon surface at the first silicon deposition temperature under the second ambient for a deposition period sufficient to form a first epitaxial single crystal silicon region having a first thickness on the silicon surface.

3. A method of forming a single crystal silicon structure according to claim 2, wherein:
   the silicon source gas includes at least one compound selected from a group consisting of $SiH_xZ_y$, wherein Z is selected from a group consisting of the halogens and wherein x and y are integers satisfying the expressions $0 \leq x \leq 4$, $0 \leq y \leq 4$ and $x+y=4$; $Si_2H_{x'}Z_{y'}$, wherein x' and y' are integers satisfying the expressions $0 \leq x' \leq 6$, $0 \leq y' \leq 6$ and $x'+y'=6$; and $Si_3H_{x''}Z_{y''}$, wherein x" and y" satisfying the expressions $0 \leq x'' \leq 8$, $0 \leq y'' \leq 8$ and $x''+y''=8$
   the carrier gas includes at least one gas selected from a group consisting of nitrogen, argon and helium, wherein a volume ratio between the silicon source gas and the carrier gas is selected to provide an acceptable deposition uniformity and acceptable deposition rate.

4. A method of forming a single crystal silicon structure according to claim 3, wherein:
   the volume ratio between the silicon source gas and the carrier gas is selected to be between about 1:1 and about 10,000:1.

5. A method of forming a single crystal silicon structure according to claim 3, wherein:
   the silicon source gas includes at least one compound selected from a group consisting of $SiH_4$, $SiH_3Cl$, $SiH_2Cl_2$, $SiHCl_3$, $SiCl_4$ and $Si_2H_6$;
   the carrier gas is nitrogen; and
   the volume ratio between the silicon source gas and the carrier gas is between about 1:1 and about 1000:1.

6. A method of forming a single crystal silicon structure according to claim 5, wherein:
   the silicon source gas is $SiH_4$;
   the carrier gas is nitrogen;
   the volume ratio between the silicon source gas and the carrier gas is between about 1:1 and about 1000:1; and
   the second pressure range is between about 200 mTorr and about 600 mTorr.

7. A method of forming a single crystal silicon structure according to claim 6, wherein:
   the second pressure range is between about 300 mTorr and about 500 mTorr.

8. A method of forming a single crystal silicon structure according to claim 2, wherein:
preparing the single crystal silicon surface includes removing native oxide from the silicon surface and forming a hydrogen passivation layer on the silicon surface.

9. A method of forming a single crystal silicon structure according to claim 8, wherein:
the native oxide is removed from the silicon surface using an aqueous HF solution or a plasma etch process.

10. A method of forming a single crystal silicon structure comprising:
preparing a single crystal silicon surface that is substantially free of silicon oxide and an insulator surface adjacent the silicon surface;
heating the silicon surface and the insulator surface to a first temperature of no more than about 350° C. under a first ambient maintained within a first pressure range;
further heating the silicon surface from the first temperature to a first silicon deposition temperature between about 350° C. and about 530° C. under a second ambient, the second ambient being maintained within a second pressure range, the second ambient including a silicon source gas and a non-oxidizing carrier gas; and
maintaining the silicon surface at the first silicon deposition temperature under the second ambient for a deposition period sufficient to form a first epitaxial single crystal silicon region having a first thickness on the silicon surface;
further heating the silicon surface from the first silicon deposition temperature to a second silicon deposition temperature of at least about 530° C. under a third ambient, the third ambient being maintained within a third pressure range, the third ambient including a silicon source gas and a non-oxidizing carrier gas;
maintaining the silicon surface and insulator surface at the second silicon deposition temperature under the third ambient for a deposition period sufficient to form, in a substantially simultaneous manner, a second epitaxial single crystal silicon region having a second thickness on the first epitaxial single crystal silicon region and a substantially amorphous silicon layer having a third thickness on the insulator surface; and
further heating the amorphous silicon layer to an annealing temperature sufficient to induce solid phase epitaxy and convert substantially the entire amorphous silicon layer to single crystal silicon and thereby form a single crystal silicon layer.

11. A method of forming a single crystal silicon structure according to claim 10, wherein:
the single crystal silicon surface and the insulator surface are substantially coplanar.

12. A method of forming a single crystal silicon structure according to claim 10, further comprising:
planarizing the single crystal silicon layer.

13. A method of forming a single crystal silicon structure comprising:
preparing a single crystal silicon surface;
depositing a layer of an insulating material on the silicon surface;
forming an opening through the insulating material to expose a portion of the single crystal silicon surface, the exposed portion being substantially free of silicon oxide;
performing a selective epitaxial process to fill the opening with a single crystal silicon plug, the silicon plug having an upper surface substantially free of silicon oxide and generally adjacent a top surface of the insulating material;
heating the silicon plug to a first silicon deposition temperature between about 350° C. and about 530° C. under a first ambient, the first ambient being maintained within a first pressure range, the first ambient including a silicon source gas and a non-oxidizing carrier gas;
maintaining the silicon plug at the first silicon deposition temperature under the first ambient for a deposition period sufficient to form a first epitaxial single crystal silicon region having a first thickness on the upper surface of the silicon plug;
further heating the silicon plug to a second silicon deposition temperature of at least about 530° C. under a second ambient, the second ambient being maintained within a second pressure range, the second ambient including a silicon source gas and a non-oxidizing carrier gas;
maintaining the silicon surface and insulator surface at the second silicon deposition temperature under the second ambient for a deposition period sufficient to form, in a substantially simultaneous manner, a second epitaxial single crystal silicon region having a second thickness on the first epitaxial single crystal silicon region and a substantially amorphous silicon layer having a third thickness on the insulator surface; and
further heating the amorphous silicon layer to an annealing temperature sufficient to induce solid phase epitaxy and convert substantially the entire amorphous silicon layer to single crystal silicon and form a single crystal silicon layer.

14. A method of forming a single crystal silicon structure according to claim 13, wherein:
the upper surface of the silicon plug is substantially coplanar with the top surface of the insulating material.

15. A method of forming a single crystal silicon structure according to claim 14, further comprising:
maintaining the selective epitaxial process for a period sufficient to overfill the opening; and
removing an upper portion of the silicon plug above the top surface of the insulating material to form a planarized surface.

16. A method of forming a multi-layer single crystal silicon structure comprising:
repeatedly
preparing a single crystal silicon surface;
depositing a layer of an insulating material on the prepared single crystal silicon surface;
forming an opening through the insulating material to expose a portion of the prepared single crystal silicon surface, the exposed portion being substantially free of silicon oxide;
performing a selective epitaxial process to fill the first opening with a single crystal silicon plug, the single crystal silicon plug having an upper surface generally adjacent a top surface of the insulating material;
heating the single crystal silicon plug to a first silicon deposition temperature between about 350° C. and about 530° C. under an ambient maintained within a first pressure range and including a silicon source gas and a non-oxidizing carrier gas; and
maintaining the single crystal silicon plug at the first silicon deposition temperature under the first ambient for a deposition period sufficient to form a first epitaxial single crystal silicon region on the upper surface of the first silicon plug;

further heating the single crystal silicon plug to a second silicon deposition temperature of at least about 530° C. under a second ambient maintained within a second pressure range and including a silicon source gas and a non-oxidizing carrier gas;

maintaining the single crystal silicon plug and the insulator surface at the second silicon deposition temperature under the second ambient for a deposition period sufficient to form, in a substantially simultaneous manner, a second epitaxial single crystal silicon region on the first epitaxial single crystal silicon region and a substantially amorphous silicon layer on the first insulator surface; and further heating the substantially amorphous silicon layer to an annealing temperature sufficient to induce solid phase epitaxy and convert substantially the entire amorphous silicon layer to single crystal silicon and thereby form a single crystal silicon layer, the single crystal silicon layer being suitable for serving as a next single crystal silicon surface;

to thereby form a multi-layer single crystal silicon structure.

17. A method of forming a multi-layer single crystal silicon structure according to claim 16, further comprising:
planarizing the single crystal silicon layer before preparing the surface for
depositing the insulating material.

18. A method of forming a multi-layer single crystal silicon structure according to claim 16, further comprising:
forming a first single crystal silicon layer having a first thickness; and
forming a second single crystal silicon layer having a second thickness, wherein the first and second single crystal silicon layers are separated by an insulating layer and connected by single crystal silicon plugs formed through the insulating layer.

19. A method of forming a multi-layer single crystal silicon structure according to claim 18, wherein:
a ratio between the first thickness and the second thickness is within a range of 3:1 to 1:3.

20. A method of forming a single crystal silicon structure comprising:
preparing a first single crystal silicon surface;
depositing a layer of a first insulating material on the first silicon surface;
forming a first opening through the first insulating material to expose a portion of the first single crystal silicon surface, the exposed portion being substantially free of silicon oxide;
heating the exposed portion of the first silicon surface to a first silicon deposition temperature between about 350° C. and about 530° C. under a first ambient, the first ambient being maintained within a first pressure range and including a silicon source gas and a non-oxidizing carrier gas; and
maintaining the first silicon surface at the first silicon deposition temperature under the first ambient for a deposition period sufficient to form a first epitaxial single crystal silicon region having a first thickness on the exposed portion of the first silicon surface;
further heating the first silicon surface and the first insulating material to a second silicon deposition temperature of at least about 500° C. under a second ambient, the second ambient being maintained within a second pressure range, the second ambient including a silicon source gas and a non-oxidizing carrier gas; and
maintaining the first silicon surface and the first insulating material at the second silicon deposition temperature under the second ambient for a deposition period sufficient to form, in a substantially simultaneous manner, a second epitaxial single crystal silicon region having a second thickness on the first epitaxial single crystal silicon region and a first substantially polycrystalline silicon layer having a third thickness on the first insulating material whereby the opening is substantially filled with polycrystalline silicon.

21. A method of forming a single crystal silicon structure according to claim 19, further comprising:
removing an upper portion of the polycrystalline silicon layer to form a planarized surface.

* * * * *